United States Patent
Mubaslat

(10) Patent No.: US 8,760,000 B2
(45) Date of Patent: Jun. 24, 2014

(54) MIXED SIGNAL CONVERSION, ISOLATION, AND TRANSMISSION FOR AEROSPACE MULTI-CHANNEL DATA AND POWER INTERFACE SYSTEMS

(75) Inventor: Saed M. Mubaslat, Miamisburg, OH (US)

(73) Assignee: Honeywell International Inc., Morristown, NJ (US)

(*) Notice: Subject to any disclaimer, the term of this patent is extended or adjusted under 35 U.S.C. 154(b) by 847 days.

(21) Appl. No.: 12/950,600

(22) Filed: Nov. 19, 2010

(65) Prior Publication Data

US 2012/0126613 A1 May 24, 2012

(51) Int. Cl.
*B60L 1/00* (2006.01)
*B60L 3/00* (2006.01)
*H02G 3/00* (2006.01)

(52) U.S. Cl.
USPC .......................................................... 307/9.1

(58) Field of Classification Search
USPC .......................................................... 307/9.1
See application file for complete search history.

(56) References Cited

U.S. PATENT DOCUMENTS

| | | | |
|---|---|---|---|
| 5,594,329 A | 1/1997 | van Ettinger et al. | |
| 5,751,536 A | 5/1998 | Haddad et al. | |
| 5,834,973 A | 11/1998 | Klatser et al. | |
| 5,994,794 A | 11/1999 | Wehrlen | |
| 6,944,559 B2 | 9/2005 | Hiltner | |
| 7,432,272 B2 | 10/2008 | Fardis et al. | |
| 2007/0285057 A1* | 12/2007 | Yano | 320/116 |

* cited by examiner

*Primary Examiner* — Carlos Amaya
(74) *Attorney, Agent, or Firm* — Shimokaji & Assoc., P.C.

(57) ABSTRACT

An electrical power distribution system for a vehicle may comprise two or more independently grounded buses. An evaluation system may selectively connectable to either of the buses. The evaluation system may comprise a primary side; and a secondary side isolated from the primary side. The primary side may be connected to transmit evaluation data to the secondary side. The primary side may be grounded at a primary grounding level. The primary side may be connectable to either of the buses so that, when connected, the grounding level of the primary side is equalized with a grounding level of the connected bus.

16 Claims, 4 Drawing Sheets

MIXED SIGNAL CONVERSION, ISOLATION, AND TRANSMISSION FOR AEROSPACE MULTI-CHANNEL DATA AND POWER INTERFACE SYSTEMS

BACKGROUND OF THE INVENTION

The present invention generally relates to fault detection and quality monitoring of multiple, independently grounded, power and data transmission circuits.

In vehicles such as aircraft or spacecraft, multiple independent and redundant bus systems may be employed to transfer power between various electrical power sources and electrical loads. Some of these same bus systems may also be employed to transmit data between various locations in the vehicle. In some instances, these multiple buses may not have a common ground. For instance, a bus that may receive power from a battery may be grounded separately from a bus that may receive power from a generator. This separate grounding may be useful to avoid undesirable effects of noise or leakage-to-ground conditions in the generator-driven bus from adversely effecting the battery-driven bus.

In a vehicle with numerous independent and redundant buses there may be a continuing need to determine the status and quality of power and data transmission on each bus. Typically, for each independent bus, a dedicated status and quality measuring device may be required. Multiple, dedicated, status and quality measuring devices may contribute to increased cost, weight and space consumption in an aerospace vehicle.

As can be seen, there is a need for a single system that may determine status and quality of multiple, independently grounded, buses in a vehicle without being dedicated to any one of the buses.

SUMMARY OF THE INVENTION

In one aspect of the invention, an electrical power distribution system for a vehicle comprises two or more independently grounded buses and an evaluation system including a primary side grounded at a first grounding level and a secondary side grounded at a second grounding level. The evaluation system is selectively connectable to either of the buses. The primary side is configured to transmit power as well as evaluation data to the secondary side and is connectable to either of the buses so that, when connected, the grounding level of the primary side is equalized with a grounding level of the connected bus.

In another aspect of the invention, an isolating bus-evaluation system comprises a primary side and a measuring device isolated from the primary side. The primary side is configured to be successively connectable to two or more buses so that, for each connected bus, a ground level of the primary side is equivalent to a ground level of the connected bus. The measuring device remains isolated from the connected bus while receiving data from the connected bus.

In yet another aspect of the invention, a method for evaluating condition of electrical distribution buses in a vehicle comprises connecting an evaluation system to a first bus so that grounding levels of the first bus and the evaluation system are equalized, performing evaluation measurements on the first bus with the evaluation system, connecting the evaluation system to a second bus so that grounding levels of the second bus and the evaluation system are equalized, and performing evaluation measurements on the second bus with the evaluation system.

These and other features, aspects and advantages of the present invention will become better understood with reference to the following drawings, description and claims.

DETAILED DESCRIPTION OF THE INVENTION

The following detailed description is of the best currently contemplated modes of carrying out exemplary embodiments of the invention. The description is not to be taken in a limiting sense, but is made merely for the purpose of illustrating the general principles of the invention, since the scope of the invention is best defined by the appended claims.

Various inventive features are described below that can each be used independently of one another or in combination with other features.

Broadly, embodiments of the present invention generally provide a non-dedicated bus-evaluation system for determining status and quality of multiple, independently grounded buses. During operation of the inventive bus-evaluation system a ground level of the bus being evaluated may be temporarily equalized with a ground level of the evaluation system.

Figure 1:
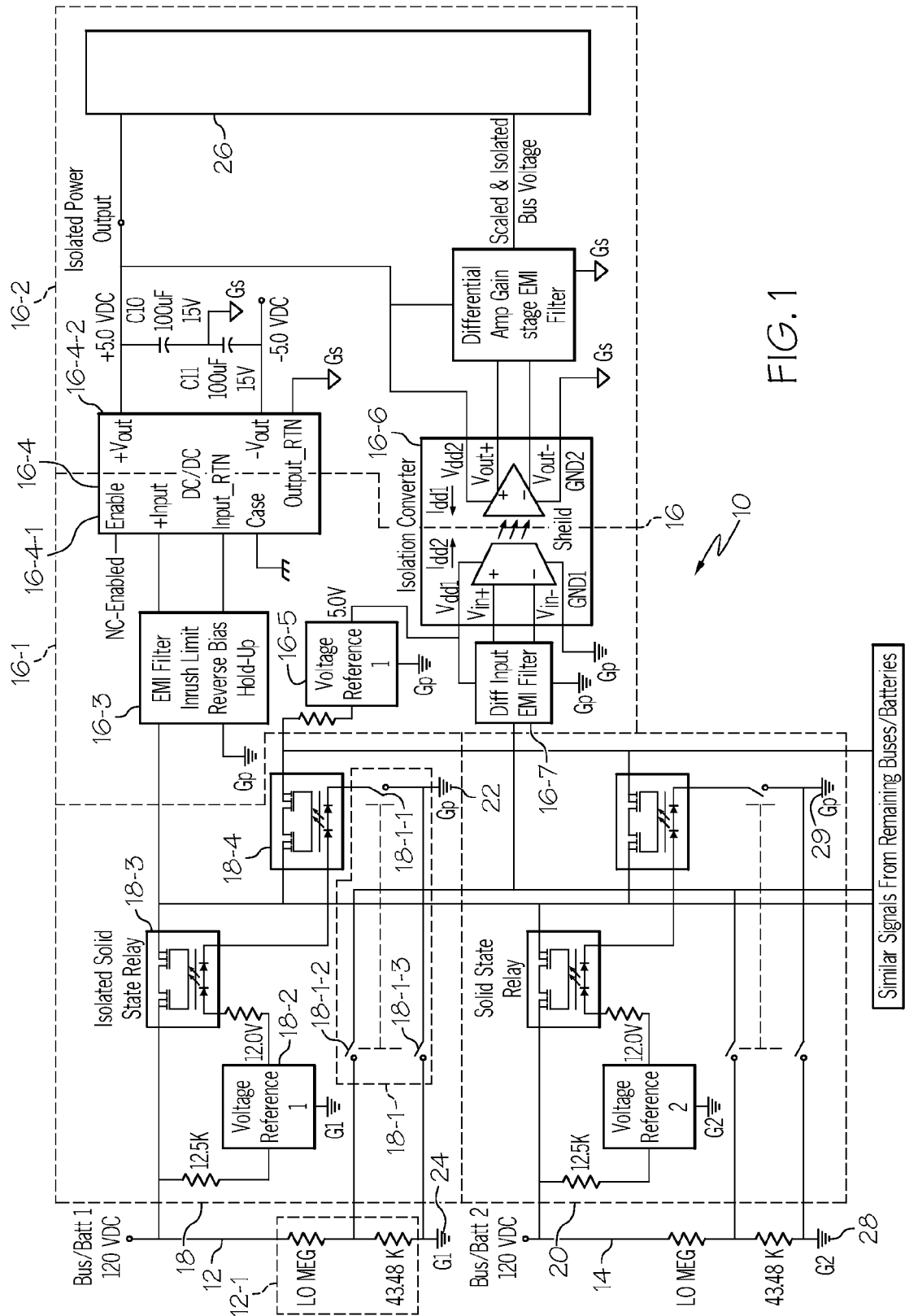
FIG. 1 is a schematic diagram of an electrical power distribution system in accordance with an embodiment of the invention.

Referring to FIG. 1, a schematic diagram illustrates an exemplary embodiment of an inventive electrical distribution system 10 of an aerospace vehicle. For purposes of simplicity, the electrical distribution system 10 is illustrated with two exemplary buses; bus 12 and bus 14. It may be noted that any number of buses may be employed in the electrical system 10. In a typical aerospace vehicle, the buses 12 and 14 may be employed to transmit electrical power and/or data. For purposes of simplicity, the electrical power transmission aspect of the system 10 may be referred to as high-voltage transmission and the data transmission aspect of the system 10 may be referred to as low-voltage transmission. It may be noted that low-voltage transmission may comprise digital or analog signals.

A bus-evaluation system 16 may provided within the electrical distribution system 10 and may be used to determine if buses 12 and 14 may be functioning properly. A measuring device 26 may be connected to or incorporated in the bus-evaluation system 16. The measuring device 26 may be employed to perform bus data acquisition and measurement. The measuring device 26 may be in the form of data storage unit and/or a simple reading display which may show the voltage levels of each bus. To provide for appropriate interaction with the bus-evaluation system 16, the buses 12 and 14 may be provided with dedicated switching units 18 and 20 respectively. Each of the switching units 18 and 20 may be provided with a ground point 22 which may have a ground level, Gp, equivalent to a ground level of a primary side 16-1 of the bus-evaluation system 16. The switching unit 20 may be constructed similarly to the switching unit 18.

The switching unit 18 may comprise a three pole switch 18-1, a voltage reference 18-2, high-voltage solid state relay 18-3 and a low-voltage solid state relay 18-4. During normal operation of the bus 12, a grounding level, G1, of the bus 12 may be maintained at ground point 24. Also, the ground point 22 may not be connected with the bus 12 because the contacts 18-1-3 may be open. In other words, the switching unit 20 may be configured such that the ground point 22 may remain disconnected from the bus 12 unless the bus 12 is connected to bus-evaluation system 16.

Whenever there is a need to evaluate a particular one of the buses, the bus-evaluation system 16 and the measuring device 26 may be connected to that bus to place the bus into a data acquisition and measuring mode. Proper grounding may be required for safety and for control of electromagnetic interferences. Also, isolation of the buses 12 and/or 14 from the measuring device 26 may be needed to limit and/or prevent propagation of any faults between the buses 12 and/or 14 and the measuring device 26.

Initiation of measuring of the bus 12 may be made through closure of all of the contacts of the switch 18-1. With the contacts 18-1-3 closed, the ground level at the ground point 24 may be equalized with the ground level at the ground point 22. In other words, a primary side 16-1 of the bus-evaluation system 16 may become commonly grounded with the bus 12. Similarly, when the bus 14 is connected to the evaluation system 16, a ground point 28 may be connected with a ground point 29 in the switch unit 20 so that the primary side 16-1 of the bus-evaluation system 16 may become commonly grounded with the bus 14.

Upon closure of the contacts 18-1-1 and 18-1-3, current may pass from the bus 12 to the relays 18-3 and 18-4 at a voltage that may be established by the voltage reference 18-2. The relay 18-4 may then pass current, at the bus voltage level, from the bus 12 to the relay 18-3 and to the primary side 16-1 of the bus evaluation system 16. Advantageously, the bus-level current may pass through a conditioning device 16-3 that may include functional features such as electromagnetic interference (EMI) filtering; inrush limitation; and reverse bias hold-up. From the conditioning device 16-3, the bus-level current may pass to a high-voltage isolation device 16-4. In an exemplary embodiment, the high-voltage isolation device 16-4 may be a DC-DC converter with a primary side 16-4-1 and a secondary side 16-4-2. The primary side 16-4-1 may be grounded at a ground level Gp and the secondary side may be grounded at a ground level Gs. It may be noted that the measuring device 26 may remain at a ground level different from that of the ground level of the measured bus during evaluation and measuring.

The relay 18-3 may be constructed with metal oxide semiconductor field effect transistors (MOSFET) in a back-to-back configuration. Consequently, the relay 18-3 may allow passage of high power DC as well as AC signals. Additionally, the relay 18-3 may be capable of switching current from the bus 12 with controlled soft-starting and without arcing, thus avoiding introduction of undesirable EMI during switching.

The relay 18-3 may pass bus-voltage-level current to the relay 18-4. From the relay 18-4, the bus-voltage-level current may undergo voltage reduction through a voltage reference 16-5. Low-voltage powering current may emerge from the voltage reference 16-5 and may be applied to power the primary side of a low-voltage isolation converter 16-6 and a low-voltage conditioning device 16-7.

A voltage sampling device 12-1 may be incorporated in the bus 12 to provide a low-voltage level signal proportional to the voltage level of the bus 12. This sampling device 12-1 may be as simple as a voltage divider, a Hall sensor, or any other device that may provide a low voltage signal proportional to the bus voltage. Low-voltage-level current may pass from the sampling device 12-1 through the contacts 18-1-2 and into the low-voltage conditioning device 16-7. The conditioning device 16-7 may perform various conditioning functions such as EMI filtering, gain adjustment, and differential noise cancellation. Output from the conditioning device 16-7 may pass to the low-voltage isolation converter 16-6. The isolation converter 16-6 may have various configurations. In non-limiting examples, the converter 16-6 may be an isolation amplifier, a switched transformer, an optical isolator, a sigma delta converter, or any other form of an isolated analog to digital (A/D) converter coupled to a digital to analog (D/A) converter circuit.

It may be seen that the evaluation system 16 may provide for data conversion and transmission of high or low voltage analog and/or digital signals while maintaining proper isolation and grounding to avoid the potential of multiple current loop shorts and failures at either the primary or secondary sides of the system 16, while maintaining proper isolation from other buses as well.

With proper grounding for safety, immunity against electrostatic interferences and avoidance of accumulation of static charge may be achieved. The isolated output of the DC to DC converter 16-4-2 may provide power to the isolated secondary side of the isolation converter 16-6.

It can be seen the evaluation system 16 may receive operational power from the bus 12 only when engaged with the bus 12 through the switch 18-1. In this exemplary power-saving configuration, the evaluation system 16 may remain dormant during normal operation of the bus 12 and may consume power only when the bus 12 is in the data acquisition and measuring mode.

Figure 2:
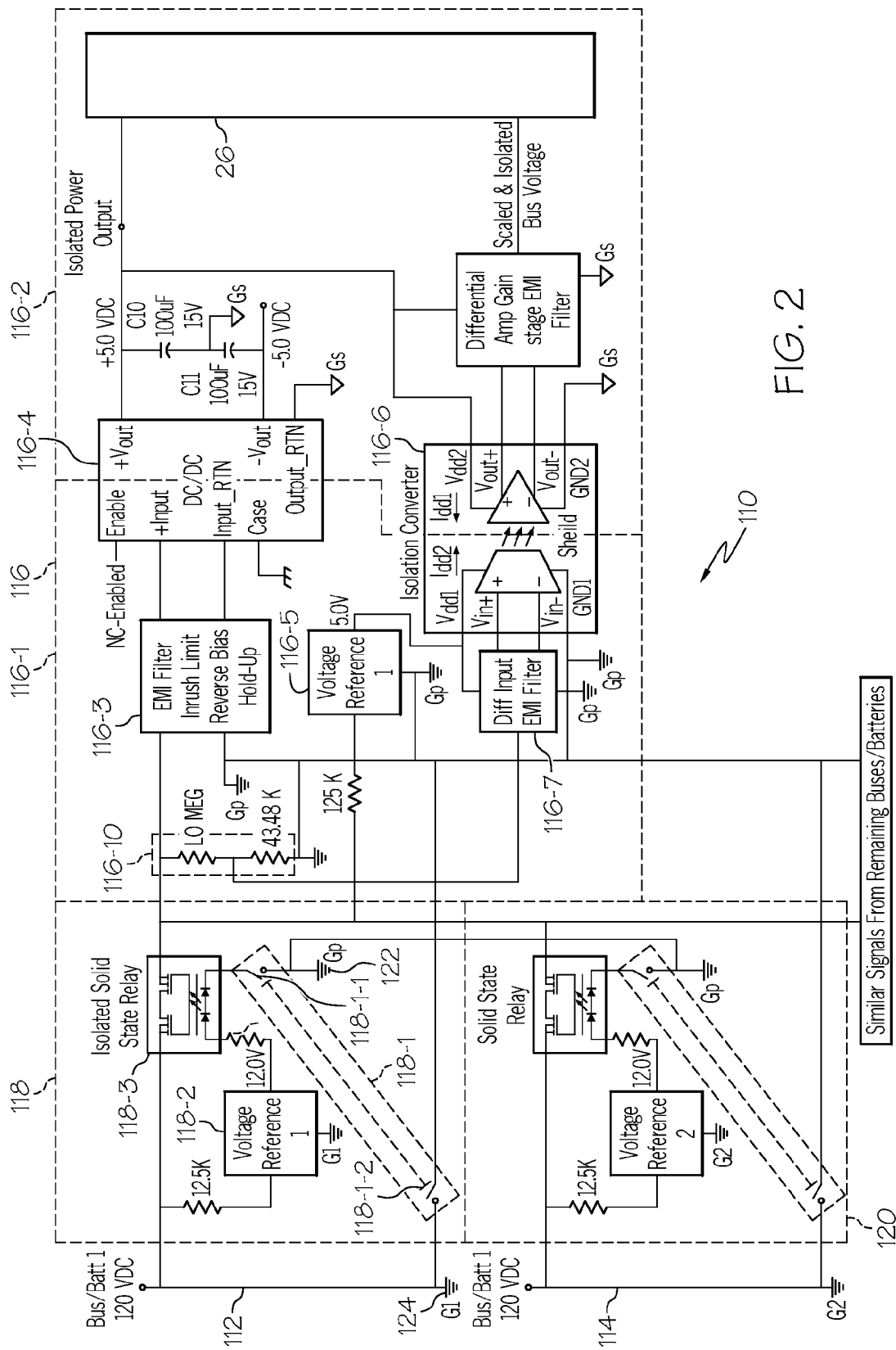
FIG. 2 is a schematic diagram of another embodiment of an electrical power distribution system in accordance with the invention.

Referring now to FIG. 2, an alternate embodiment of the present invention may be shown as an electrical distribution system 110 with buses 112 and 114. To provide for appropriate interaction with a bus-evaluation system 116, the buses 112 and 114 may be provided with dedicated switching units 118 and 120 respectively. Each of the switching units 118 and 120 may be provided with a ground point 122 which may have a ground level, Gp, equivalent to a ground level of a primary side 116-1 of the bus-evaluation system 116. In the system 110, a sampled signal representing the voltage of a selected bus 112 or 114 may be produced with a non-dedicated sampling device 116-10 which may be incorporated in the evaluation system 116.

The switching unit 118 may comprise a two pole switch 118-1, a voltage reference 118-2, and a solid state relay 18-3. During normal operation of the bus 112, a grounding level, G1, of the bus 112 may be maintained at grounding point 124. Also, the ground point 122 may not be connected with the bus 112 because contacts 118-1-2 may be open.

Initiation of measuring may be made through closure of all of the contacts of the switch 118-1. With the contacts 18-1-2 closed, ground level at the ground point 124 may be equalized with ground level at the ground point 122. In other words, a primary side 116-1 of the bus-evaluation system 116 may become commonly grounded with the bus 112.

Upon closure of the contacts 18-1-1, current may pass from the bus 112 to the relay 118-3 at a voltage that may be established by a voltage reference 118-2. The relay 118-3 may then pass current, at the bus voltage level, from the bus 112 to the primary side 116-1 of the bus evaluation system 116. Advantageously, the bus-level current may pass through a conditioning device 116-3 which may include functional features such as electromagnetic interference (EMI) filtering; inrush limiting; and reverse bias hold-up. From the conditioning device 116-3 the bus-level current may pass to a high-voltage isolation device 116-4. In an exemplary embodiment the high-voltage isolation device 116-4 may be a DC-DC converter with a primary side 116-4-1 and a secondary side 116-4-2. The primary side 116-4-1 may be grounded at a ground level Gp and the secondary side may be grounded at a ground level Gs.

The relay 118-3 may be constructed with metal oxide semiconductor field effect transistors (MOSFET) in a back-to-back configuration. Consequently, the relay 118-3 may allow passage of either DC or AC signals. Additionally, the relay 118-3 may be capable of switching current from the bus 112 with controlled soft-starting and without arcing, thus avoiding introduction of undesirable EMI during switching.

A voltage sampling device 116-10 may be incorporated in the bus-evaluation system 116 to provide a low-voltage level output signal proportional to a high-voltage-level input from the bus to be measured. Low-voltage-level current may pass from the sampling device 116-10 into a low-voltage conditioning device 116-7. The conditioning device 116-7 may perform various conditioning functions such as EMI filtering, gain adjustment, and differential noise cancellation. Output from the conditioning device 116-7 may pass to the low-voltage isolation converter 116-6. The isolation converter 116-6 may have various configurations. In non-limiting examples the converter may be an isolation amplifier, a switched transformer, an optical isolator, a sigma delta converter, or any other form of an isolated analog to digital (A/D) converter coupled to a digital to analog (D/A) converter circuit.

Figure 3:
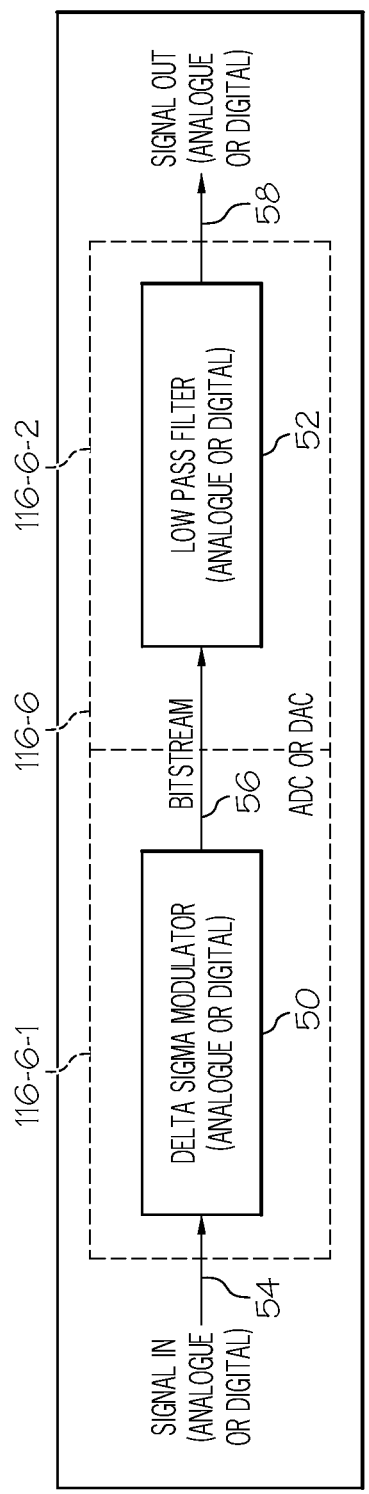
FIG. 3 is a block diagram of an isolating converter in accordance with an embodiment of the invention.

Referring now to FIG. 3, an exemplary embodiment of the low-voltage isolation converter 116-6 is shown in block diagram format. The converter 116-6 may comprise a delta sigma modulator 50 positioned in a primary side 116-6-1 of the converter 116-6; and a low pass filter 52 positioned in a secondary side 116-6-2 of the converter 116-6. A low-voltage signal 54, either analog or digital, may be introduced into the modulator 50. The modulator 50 may produce a bitstream 56 which may be introduced into the low pass filter 52. An output signal 58, either analog or digital may emerge from the low pass filter.

Figure 4:
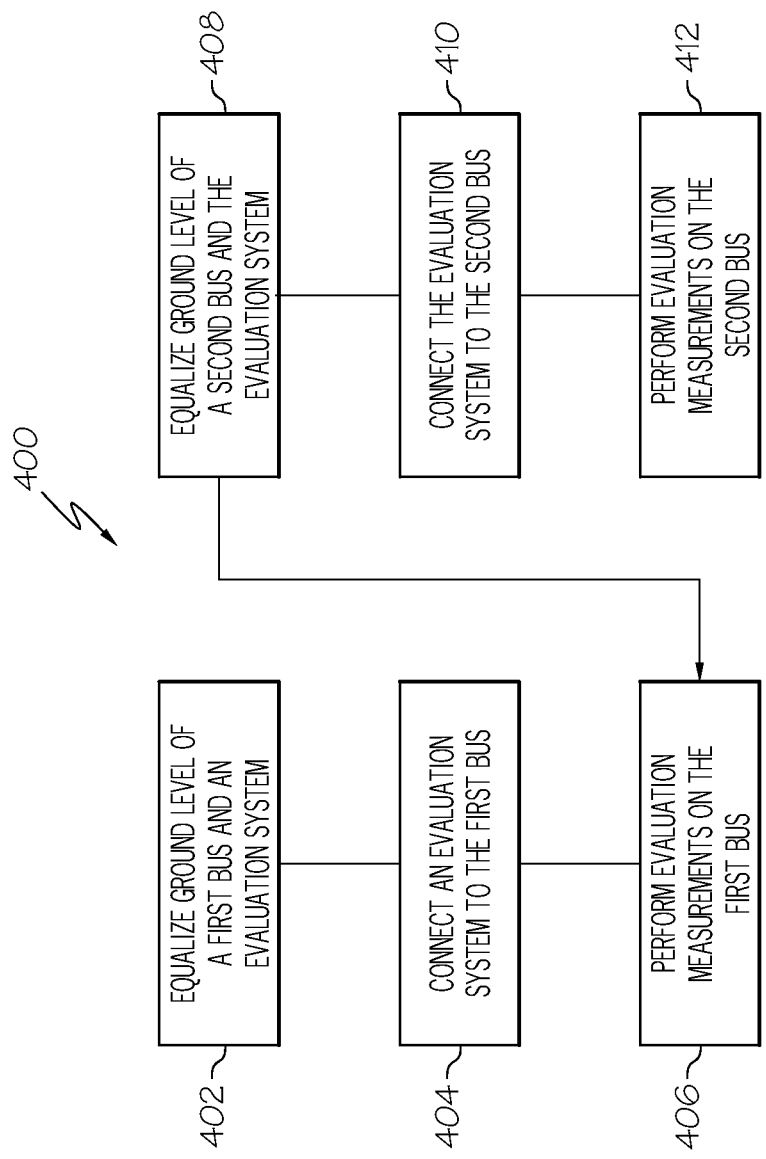
FIG. 4 is a flow chart of a method for evaluating condition of electrical distribution buses in accordance with an embodiment of the invention.

Referring now to FIG. 4, an exemplary method 400 may be employed for evaluating condition of electrical distribution buses in a vehicle. In a step 402, ground level of a first bus may be equalized with ground level of an evaluation system (e.g., the ground point 22 may be connected to the ground point 24). In a step 404, an evaluation system may be connected to a first bus (e.g., the evaluation system 16 may be connected to the bus 12 through the dedicated switching unit 18 so that the ground point 22 may be interconnected with the ground point 24). In a step 406, evaluation measurements may be performed on the first bus with the evaluation system (e.g., the measuring device 26 may be employed to evaluate condition of the bus 12). In a step 408, ground level of a second bus may be equalized with the ground level of the evaluation system (e.g., the ground point 29 may be connected to the ground point 28). In a step 410, the evaluation system may be connected to the second bus (e.g., the evaluation system 16 may be connected to the bus 14 through the dedicated switching unit 20 so that the ground point 29 may be interconnected with the ground point 28). In a step 412, evaluation measurements may be performed on the second bus with the evaluation system (e.g., the measuring device 26 may be employed to evaluate condition of the bus 14).

It should be understood, of course, that the foregoing relates to exemplary embodiments of the invention and that modifications may be made without departing from the spirit and scope of the invention as set forth in the following claims.

I claim:

1. An electrical power distribution system for a vehicle, comprising:
   two or more independently grounded buses; and
   an evaluation system including a primary side grounded at a first grounding level Gp and a secondary side grounded at a second grounding level, the evaluation system selectively connectable to at least one of the two or more independently grounded buses,
   the primary side configured to transmit evaluation data to the secondary side;
   a measuring device isolated from the primary side;
   a high-voltage isolation device comprising a DC-DC converter configured to transmit high-voltage data from a connected one of the two or more independently grounded buses to the measuring device,
   a low-voltage isolation device configured to transmit communications data from the connected one of the two or more independently grounded buses to the measuring device, wherein
   the measuring device isolated from the connected one of the two or more independently grounded buses while receiving data from the connected one of the two or more independently grounded buses; and
   the primary side connectable to at least one of the two or more independently grounded buses so that, when connected, the grounding level of the primary side is equalized with a grounding level of the connected two or more independently grounded buses.

2. The distribution system of claim 1, including dedicated switching units for the two or more buses, each switching unit configured to connect its associated bus with the evaluation system.

3. The distribution system of claim 2, wherein the switching units are configured to transfer operational power to the evaluation system from one of the two or more independently grounded buses only when the evaluation system is connected to one of the two or more independently grounded buses.

4. The distribution system of claim 2, wherein:
   the switching units comprise ground points at a ground level equivalent to a ground level of a primary side of the evaluation system; and
   the switching units are configured such that the ground points remain disconnected from at least one of the two or more independently grounded buses unless the at least one of the two or more independently grounded buses is connected to the evaluation system.

5. The distribution system of claim 2, wherein the switching units include solid state relays.

6. The distribution system of claim 5, wherein at least one of the solid state relays includes two or more MOSFETS configured to pass both AC and DC signals.

7. An isolating bus-evaluation system, comprising:
   a primary side;
   a measuring device isolated from the primary side, wherein:
   the primary side is configured to successively connect to two or more buses so that, for the connected two or more buses, a ground level of the primary side is equivalent to a ground level of the connected two or more buses; and
   the measuring device remains isolated from the connected two or more buses while receiving data from the connected two or more buses;
   a high-voltage isolation device including a DC-DC converter configured to transmit high-voltage data from a connected one of the two or more buses to the measuring device; and a low-voltage isolation device configured to transmit low voltage data from the connected two or more buses to the measuring device.

8. The evaluation system of claim 7, including:
a high-voltage current conditioning device connected to the high-voltage isolation device; and
a low-voltage current conditioning device connected to the low-voltage isolation device.

9. The evaluation system of claim 7, wherein the low-voltage isolation device comprises a delta sigma converter and a low pass filter.

10. The evaluation system of claim 7, including a voltage sampling device configured to sample a high-voltage input to the evaluation system and produce a low-voltage input for the evaluation system.

11. The evaluation system of claim 7, including:
a high-voltage current conditioning device connected to the high-voltage isolation device; and
a low-voltage current conditioning device connected to the low-voltage isolation device.

12. A method for evaluating condition of electrical distribution buses in a vehicle, comprising:
connecting an evaluation system to a first bus so that grounding levels of the first bus and the evaluation system are equalized;
performing evaluation measurements on the first bus with the evaluation system;
connecting the evaluation system to a second bus so that grounding levels of the second bus and the evaluation system are equalized; and
performing evaluation measurements on the second bus with the evaluation system,
wherein performing the evaluation measurements on the first bus or the second bus includes:
connecting the first or second bus to a primary side of high-voltage isolating converter;
connecting the first or second bus to a sampling device to produce low-voltage current proportional to bus voltage of the first or second bus;
passing the low-voltage current to a primary side of a low-voltage isolating converter;
passing high-voltage data from a secondary side of the high-voltage converter to a measuring device; and
passing low-voltage data from a secondary side of the low-voltage converter to the measuring device.

13. The method of claim 12, wherein passing the low-voltage data to the measuring device includes:
producing a bitstream with a delta sigma modulator; and
passing the bitstream to a low pass filter.

14. The method of claim 12, wherein connecting the evaluation system to the first and second buses includes actuating a solid state relay to transfer current from the bus to the evaluation device without producing arcing.

15. The method of claim 12, including powering an isolated secondary side of an isolation converter from powering an isolated secondary output of a DC to DC converter.

16. The method of claim 12, including powering the evaluation system with current from the first or second bus to which the evaluation system is connected.

* * * * *